(12) United States Patent
Kang et al.

(10) Patent No.: US 6,657,606 B2
(45) Date of Patent: Dec. 2, 2003

(54) LIQUID CRYSTAL DISPLAY DEVICE HAVING A FLEXIBLE CIRCUIT BOARD

(75) Inventors: Sin-Gu Kang, Kyunggi-do (KR); Sun-Kyu Son, Seoul (KR); Kyung-Seop Kim, Kyunggi-do (KR); Min-Sung Choi, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 190 days.

(21) Appl. No.: 09/886,128

(22) Filed: Jun. 22, 2001

(65) Prior Publication Data

US 2002/0027634 A1 Mar. 7, 2002

(30) Foreign Application Priority Data

Jul. 20, 2000 (KR) .......................... 2000-41705
Jul. 20, 2000 (KR) .......................... 2000-41710

(51) Int. Cl.$^7$ .................................................. G09G 3/36
(52) U.S. Cl. ............................................ 345/87; 349/150
(58) Field of Search ............................. 345/87; 349/150

(56) References Cited

U.S. PATENT DOCUMENTS 6,020,867 A * 2/2000 Shimada ..................... 345/87

* cited by examiner

Primary Examiner—John F. Niebling
Assistant Examiner—Andre C Stevenson
(74) Attorney, Agent, or Firm—McGuireWoods LLP

(57) ABSTRACT

A liquid crystal display device has a flexible circuit board which can prevent the disconnections of output side conductive layer patterns formed at the border portion of the solder resist layer. A flexible base film has a liquid crystal panel engaging portion, engaged with a liquid crystal panel on one side thereof. A driving IC is formed at the central portion of the base film to apply driving signals to driving devices of the liquid crystal panel. A first conductive layer patterns are extended on the base film from the driving IC to the liquid crystal panel engaging portion to electrically connect the driving IC to the liquid crystal panel. A solder resin layer exposes the first conductive layer patterns formed on the liquid crystal panel engaging portion and covers the first conductive layer patterns of the periphery of the driving IC. A reinforcing member prevents the first conductive layer patterns from disconnecting due to the bending fatigue of the border portion of the liquid crystal panel engaging portion and the solder resin layer.

23 Claims, 9 Drawing Sheets

LIQUID CRYSTAL DISPLAY DEVICE HAVING A FLEXIBLE CIRCUIT BOARD

BACKGROUND OF THE INVENTION

1. Field of the Invention

The present invention relates to a liquid crystal display device having a flexible printed circuit board, and more particularly to a liquid crystal display device having a flexible circuit board with a driving chip mounted thereon that connects a liquid crystal panel to a printed circuit board.

2. Description of the Related Art

A liquid crystal display device applies a voltage to a layer of liquid crystal to convert its molecular arrangement. The liquid crystal display device converts the changes of the optical properties of liquid crystal cells that transmits light according to the molecular arrangement, and uses the light modulation of the liquid crystal cells.

The liquid crystal display device is sorted into a TN (Twisted Nematic) type and a STN (Super-Twisted Nematic) type. The liquid crystal display device also can be sorted into an active matrix display type, which uses a switching device and a TN liquid crystal, and a passive matrix type, which uses an STN liquid crystal, according to the driving method. A TFT-LCD that drives an LCD by using a TFT has a relatively simple circuit, and it is widely used in computers.

The liquid crystal display device includes a liquid crystal panel to which electrical signals are applied to determine whether the light has been passed. The liquid crystal panel is a passive light device. So, a back light assembly for providing the liquid crystal display device with the light, is attached to the rear surface of the liquid crystal panel.

A source part that comprises a source driving IC for applying screen data to display the image, and a gate part that comprises a gate driving IC for applying gate signals for driving the gate device of a thin film transistor of the liquid crystal panel, are attached to the liquid crystal panel. The image signals that are applied from the outside are converted into data signals for driving the liquid crystal panel and gate signals for driving the thin film transistor. The data signals and the gate signals are applied to the transistor of the liquid crystal panel through the source part and the gate part. Therefore, the liquid crystal of the liquid crystal panel receives electrical signals, and the light from the back light assembly is regulated to display images.

The method of connecting the liquid crystal panel to the source and gate driving IC is sorted into a COG (Chip-On Glass) type and a TAB (Tape Automated Bonding) type. According to the COG type, a driving IC of a semiconductor package type is directly mounted to the gate and data areas of the liquid crystal panel, to transfer the electrical signals to the liquid crystal panel. The driving IC uses an anisotropic conductive film, and is bonded to the liquid crystal panel.

According to the TAB type, the liquid crystal panel is directly connected to the printed circuit board by using a tape carrier package to which the driving IC is mounted. One end of the tape carrier package is connected to the liquid crystal panel, and the other end of the tape carrier package is connected to the printed circuit board. Then, the input wire of the carrier package is connected to the output pad of the printed circuit board by soldering or using an anisotropic conductive film.

Examples of the liquid crystal panel modules that use the tape carrier package are disclosed in U.S. Pat. No. 5,572,346 issued to Sakamoto et al, and U.S. Pat. No. 6,061,246 issued to Oh et al. The conventional TFT liquid crystal modules mainly use the tape carrier package to mount the driving IC.

Recently, LCD modules of various structures have been developed to make it slim. In particular, considering that LCD modules are used in portable computers, the weight of the LCD module is important. If the tape carrier package is applied to the LCD modules, the flexibility is insufficient. Therefore, a flexible circuit board is used in an LCD module. A COF (Chip On Film) method is used to mount the driving IC on the flexible circuit board. According to the COF method, a chip is mounted onto the printed circuit board by using a TAB.

FIG. 1 is a top view showing a flexible circuit board onto which a chip is mounted by the COF method. FIG. 2 is a side cross-sectional view showing a liquid crystal module to which a flexible circuit board is mounted. Referring to FIGS. 1 and 2, a driving IC 20 for driving a liquid crystal panel is mounted at the center of the base film 10 of a tape-shape. The base film 10 comprises a printed circuit board engaging portion 12 for connecting a printed circuit board 30 and a liquid crystal panel engaging portion 14 for engaging with a liquid crystal panel 40. A solder resin layer 16 is formed between the printed circuit board engaging portion 12 and the liquid crystal panel engaging portion 14.

Input side conductive layer patterns 22 for transferring driving signals from the printed circuit board to the driving IC 20 are formed on the printed circuit board engaging portion 12. The solder resin layer 16 covers the input side conductive layer patterns 22 and is formed around the driving IC 20.

Output side conductive layer patterns 24 for applying the driving signals from the driving IC 20 to the liquid crystal panel are formed on the liquid crystal panel engaging portion 14. The solder resin layer 16 covers the output side conductive layer patterns 24 and is formed around the driving IC 20.

An align mark 26 is formed at the outmost patterns of the both sides of the output side conductive layer patterns 24 to easily engage the wires of the liquid crystal panel 14.

As shown in FIG. 2, a back light assembly 50 that provides the light is mounted in the liquid crystal display module. A display unit comprising the liquid crystal panel 40 is mounted onto the back light assembly. The input side of the liquid crystal panel 40 is connected to the output side conductive layer patterns 24 of the flexible circuit board.

The flexible circuit board wraps around the side wall of the mold frame 60, and is bent so as to adhere to the bottom surface of the mold frame 60. The input side conductive layer patterns 22 of the flexible circuit board are connected to the output side of the printed circuit board 30, and the printed circuit board 30 is adhered to the bottom of the mold frame 60. A polished inclined surface is formed at the end portion of the glass board of the liquid crystal panel 40.

The aforementioned conventional flexible circuit board is manufactured by the chip-on-film package method. By the chip-on-film package method, the reliability of the liquid crystal display device module of a thin film transistor and the manufacturing cost of the liquid crystal display device will be reduced.

However, since the flexible circuit board is too flexible, the border portion (A portion of FIGS. 1 and 2) of the solder resist 16 may contact the edge portion of the liquid crystal panel 40, which may cause disconnections.

SUMMARY OF THE INVENTION

The present invention has been made to solve the above-mentioned problems, and accordingly, it is the object of the present invention to provide a liquid crystal display device having a flexible circuit board that can prevent the output side conductive layer patterns from disconnection caused by bending and exterior stresses.

In order to achieve the aforementioned object of the present invention, the present invention provides a liquid crystal display device including a display unit having a liquid crystal display panel, and a flexible circuit board attached to the liquid crystal display panel, for applying driving signals to said liquid crystal display panel for driving the liquid crystal panel, a back light assembly that provides light to the display unit, a mold frame for receiving the liquid crystal display panel and the back light assembly, a chassis, being coupled to said mold frame, for fixing said liquid crystal display panel and said back light assembly to said mold frame. The flexible circuit board includes a flexible base film having a liquid crystal panel engaging portion. A driving IC is formed at the center of the base film and applies driving signals to driving devices of the liquid crystal panel. First conductive layer patterns are extended on the base film from the driving IC to the liquid crystal panel engaging portion, for electrically connecting the driving IC to the liquid crystal panel. A solder resin layer exposes the first conductive layer patterns formed on the liquid crystal panel engaging portion and covering the first conductive layer patterns of the periphery of the driving IC. A reinforcing means prevents the first conductive layer patterns from disconnecting due to the bending fatigue of the border portion of the liquid crystal panel engaging portion and the solder resin layer.

According to the present invention, the flexible circuit board includes a reinforcing member that can alleviate the inflection in the vicinity of the border surface of the solder resin layer. The reinforcing member can move the inflection point from the border of the solder resist layer, to the center of the solder resist layer. Therefore, the stresses on the solder resist layer are distributed, to effectively prevent the curvature changes caused by the inflection. It also prevents the cracks and disconnections of the output side conductive layer patterns formed in the vicinity of the border surface of the solder resin layer.

BRIEF DESCRIPTION OF THE DRAWINGS

The aforementioned and other objects and advantages of the present invention will become readily apparent with reference to the following detailed description, when considered in conjunction with the accompanying drawings wherein.

DETAILED DESCRIPTION OF THE PREFERRED EMBODIMENT

Hereinafter, preferred embodiments of the present invention will be explained in detail with reference to the attached drawings.

Embodiment 1

Figure 1:
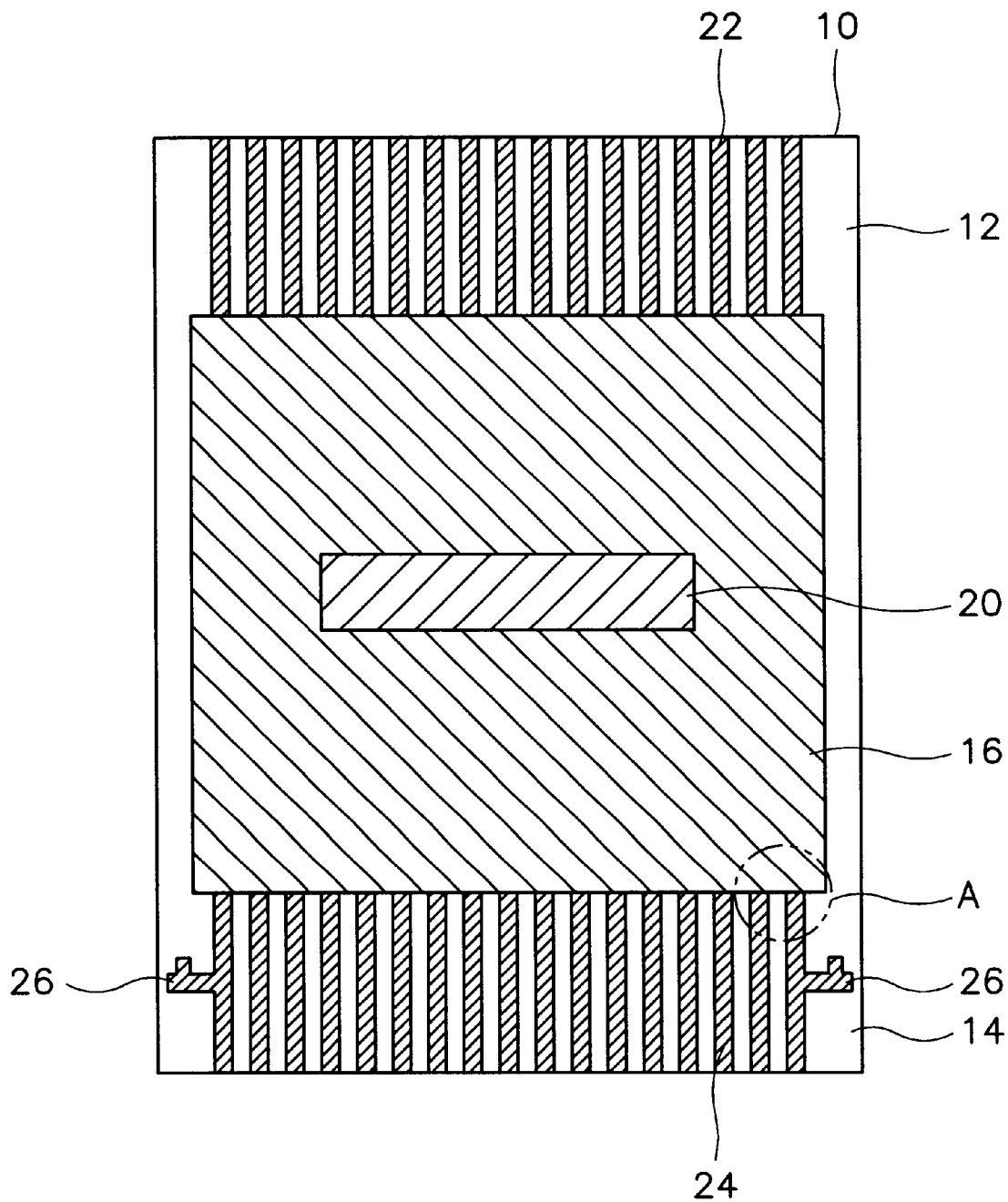
FIG. 1 is a top view showing a flexible circuit board where a chip is mounted by a conventional COF method.
Figure 2:
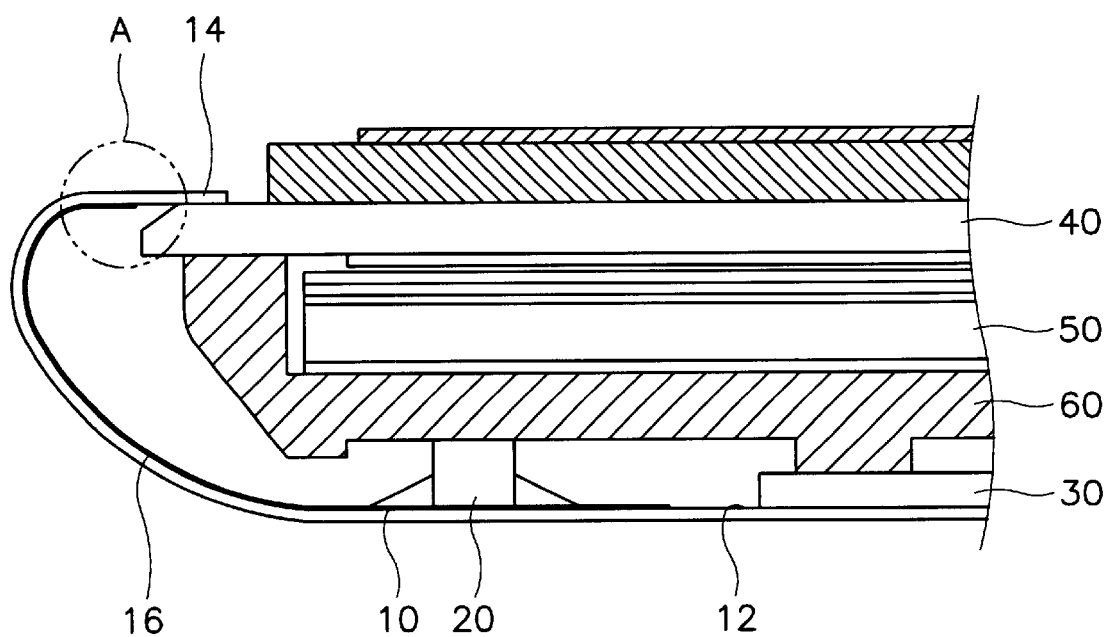
FIG. 2 is a side cross-sectional view showing the flexible circuit board of FIG. 1 that is mounted to a liquid crystal display module.
Figure 3:
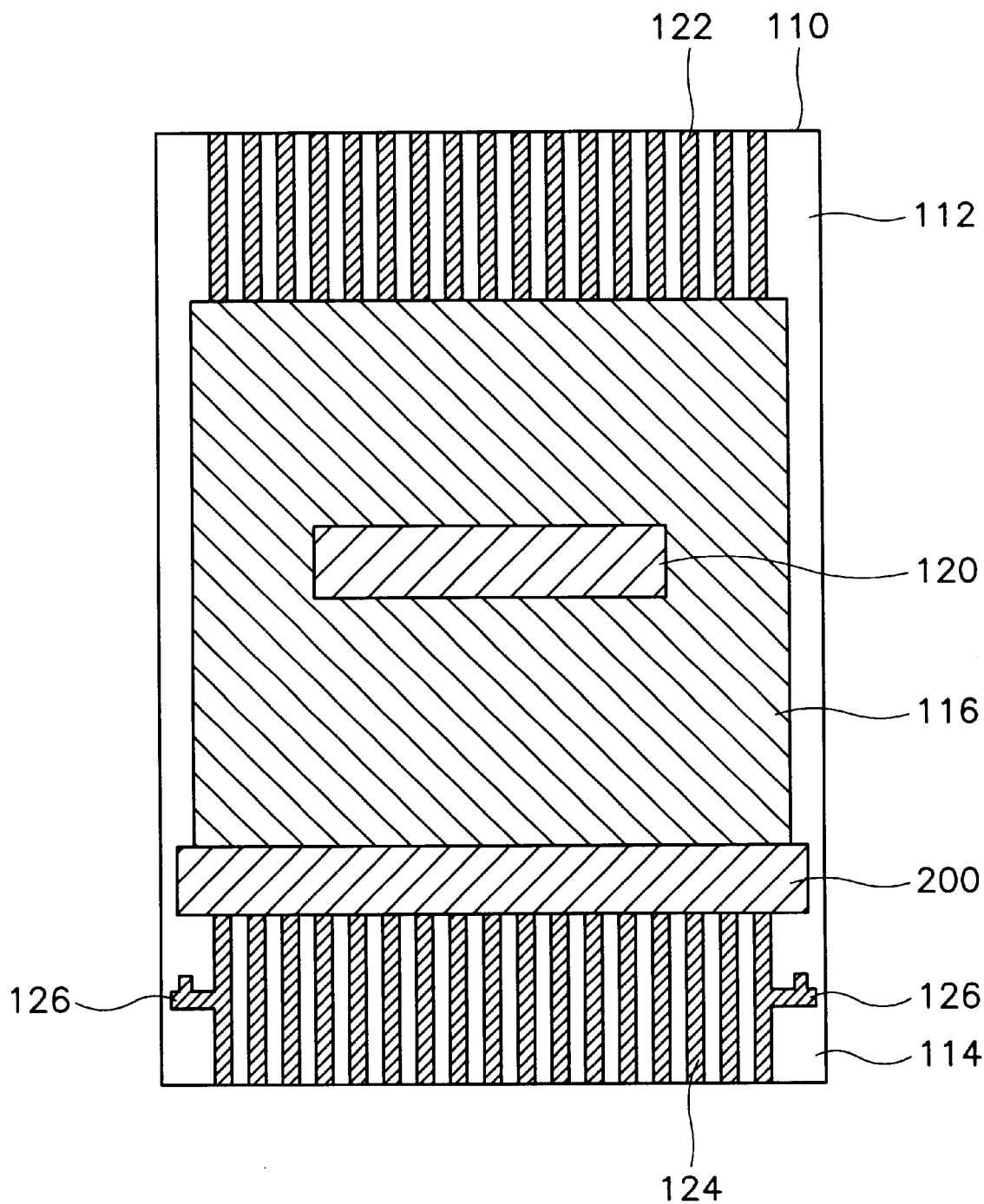
FIG. 3 is a top view showing a flexible circuit board manufactured by a COF package method according to the first preferred embodiment of the present invention.
Figure 4:
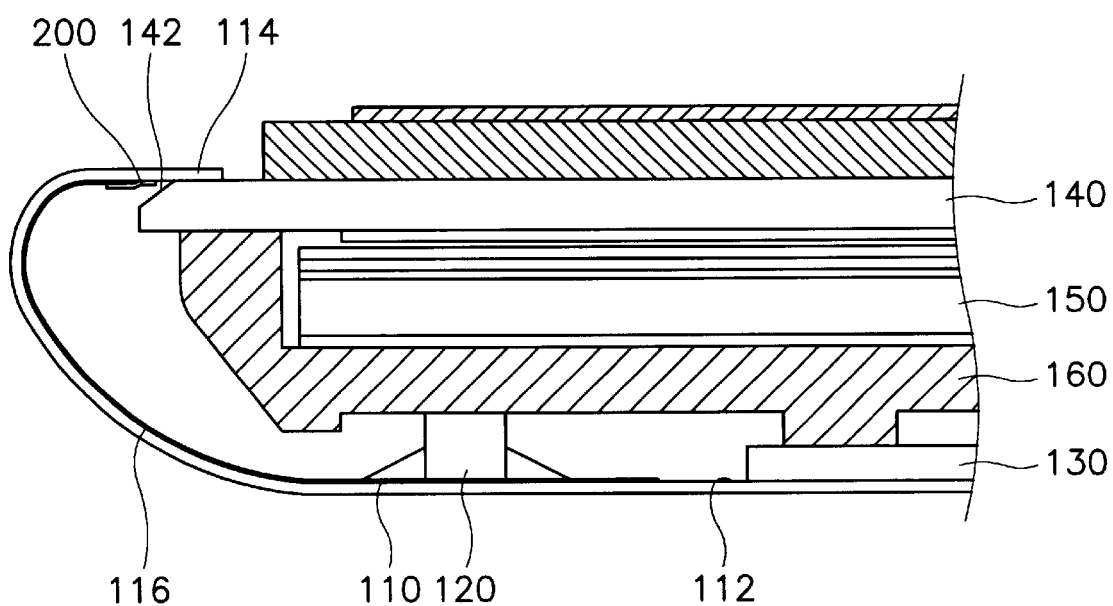
FIG. 4 is a side cross-sectional view showing the flexible circuit board of FIG. 3, which is mounted to a liquid crystal display module.

FIG. 3 is a top view showing a flexible circuit board manufactured by a COF package method according to this embodiment. FIG. 4 is a side cross-sectional view of the flexible circuit board in FIG. 3, which is mounted to a liquid crystal display module (or device) in accordance with this embodiment.

Referring to FIGS. 3 and 4, the flexible circuit board according to this embodiment includes a flexible base film 110. A printed circuit board engaging portion 112 that is to be engaged with the printed circuit board, is provided on one side of the flexible base film 110, and a liquid crystal panel engaging portion 114 that is to be engaged with a liquid crystal panel, is provided on the other side of the flexible base film 110.

A driving IC 120 is mounted at the center of the flexible base film 112, which is located between the printed circuit board engaging portion 112, and the liquid crystal panel engaging portion 114. The driving IC 120 receives driving signals for driving the liquid crystal panel from outside, and transfers the driving signals to devices of the liquid crystal panel.

Input side conductive layer patterns 122 are first conductive patterns that electrically connect the printed circuit board to transfer the driving signals from the printed circuit board to the driving IC 120. They are formed on the printed circuit board engaging portion 112. The input side conductive layer patterns 122 are extended to the driving IC 120. The input side conductive layer patterns 122 formed in the vicinity of the driving IC 120 are covered with a solder resin layer 116.

Output side conductive layer patterns 124 are second conductive patterns electrically connecting the driving devices of the liquid crystal panel to applying the driving signals to the driving devices of the liquid crystal panel. They are formed on the liquid crystal panel engaging portion 114. The output side conductive layer patterns 124 are extended to the driving IC 120. The output side conductive layer patterns 124 formed in the vicinity of the driving IC 120 are covered with the solder resin layer 116.

An align mark 126 are formed at both outermost patterns of the output side conductive layer patterns 124 to align them with the wires of the liquid crystal panel 140.

The input side conductive layer patterns 122 and the output side conductive layer patterns 124 are formed by using such metal as copper.

The solder resin layer 116 is formed in the vicinity of the driving IC 120 between the printed circuit board engaging portion 112 and the liquid crystal panel engaging portion 114. More particularly, the solder resin layer 116 partially covers the input side conductive layer patterns 122 and the output side conductive layer patterns 124 which are located around the driving IC 120, but partially exposes the input side conductive layer patterns 122 at the printed circuit board engaging portion 112 and the output side conductive patterns 124 at the liquid crystal panel engaging portion 114. For example, the solder resin layer 116 is comprised of a polyamide resin, and is about 20 µm thick. Thus, the printed circuit engaging portion 112 is defined from the upper end of the solder resin layer 116 to the upper end of the flexible base film 110. Likewise, the liquid crystal panel engaging portion 114 is defined from the lower end of the solder resin layer 116 to the lower end of the flexible base film 110 in FIG. 3.

A reinforcing resin layer 200 as a reinforcing member is formed so as to cover the border portion of the solder resin layer 126 and the liquid crystal panel engaging portion 114. The reinforcing resin layer 200 prevents the output side conductive layers 124 from disconnection caused by the bending of the flexible circuit board and the bending fatigue generated by the exterior stress. This enhances the reliability of the liquid crystal display module.

It is preferable that the reinforcing resin layer 200 is made of a harder resin than the solder resin layer 116. For example, if the solder resin layer 116 is comprised of a polyamide resin, it is preferable that the reinforcing resin layer 200 is comprised of a urethane resin. Further, it is preferable that the reinforcing resin layer 200 is thicker than the solder resin layer 116. For example, the reinforcing resin layer 200 is about two to three times thicker than the solder resin layer 116. When the solder resin layer 116 is about 20 µm thick, the reinforcing resin 200 is about 40 to 60 µm thick.

The width of the reinforcing resin layer 200 is not restricted. However, the reinforcing resin layer 200 excessively extended to the inner side of the solder resin layer 116 hinders the flexibility of the flexible circuit board. On the other hand, if the width of the reinforcing resin layer is excessively small, the outside conductive resin layer patterns 124 may be disconnected. Therefore, it is preferable that the reinforcing resin layer 200 covers the solder resin layer 116 by about 0.2 to 2 mm from the border portion of the solder resin layer 126 and the liquid crystal panel engaging portion 114 towards the inside of the solder resin layer 116.

Further, it is preferable that the reinforcing resin layer 200 is extended to the polished portion at the end portion of the liquid crystal panel.

Referring to FIG. 4, a backlight assembly 150 for providing the display unit with the light is positioned in a mold frame 160 to manufacture the liquid crystal module. A display unit comprising the liquid crystal panel 140 is mounted onto the backlight assembly 150. The mold frame 160 receives the liquid crystal display panel 140 and the back light assembly 150. The input side of the liquid crystal panel 140 is connected to the output side conductive layer patterns 124 of the flexible circuit board.

The flexible circuit board is bent to wrap around the exterior portion of the side wall of the mold frame 160 and to adhere to the bottom surface of the mold frame 160. The input side conductive layer patterns 124 of the flexible circuit board are connected to the output side of the printed circuit board 130, and the printed circuit board 130 adheres to the bottom surface of the mold frame 160.

A polished inclined surface 142 is provided at the end portion of the glass board of the liquid crystal panel 140 to alleviate the stress to the flexible circuit board. It is preferable that the end of the reinforcing resin layer 200 is extended over the polished inclined surface 142 of the glass board of the liquid crystal panel 140 at the border portion of the solder resin layer 116. If the reinforcing resin layer 200 does not reach the polished inclined surface 142 of the glass board of the liquid crystal panel 140, the end portion of the glass board of the liquid crystal panel 140 contacts the output side conductive layer patterns 124 and stresses the output side conductive layer patterns 124 with friction, which may cause the disconnection. Also, if the border portion of the reinforcing resin layer 200 is extended, past the polished inclined surface 142 of the glass board, to the portion at which the output side conductive layer 124 is engaged, the output side conductive layer patterns 124 may be disconnected by the stepped portion of the solder resin layer 116.

Bending Tests and Hinge Tests

Bending tests and hinge tests have been performed on the liquid crystal display module that mounts the flexible circuit board of the first preferred embodiment.

The bending tests have been accomplished by bending the flexible circuit board and the tape carrier of the liquid crystal display module by ±135° with respect to the horizontal surface of the liquid crystal panel glass board. The disconnections of the output side conductive layer patterns 124 were checked, every 100th bendings.

The hinge tests were accomplished by mounting the liquid crystal display module to a case of a notebook computer and repeating the opening and closing operations of the liquid crystal panel of the notebook computer. After every 100 opening and closing operations, the disconnections of the output side conductive layer patterns 124 were checked.

Bending tests and hinge tests have been made on a flexible circuit board and a tape carrier package of a COF method without the reinforcing member.

Table 1 represents the results.

TABLE 1

|  | Embodiment 1 | A conventional COF | TCP |
| --- | --- | --- | --- |
| Bending Test | 2100 times | 600 times | 1000 times |
| Hinge Test | No disconnection until 50000 times | 20000 times* |  |

Note:
In the hinge test of the conventional COF, over 20000 times are approved to be suitable for the standard.

As mentioned above, the flexible circuit board manufactured according to the first preferred embodiment, remarkably improve the endurance against disconnections of the output side wire patterns caused by the stress, thereby improving the reliability of the liquid crystal display module.

Embodiment 2

Figure 5:
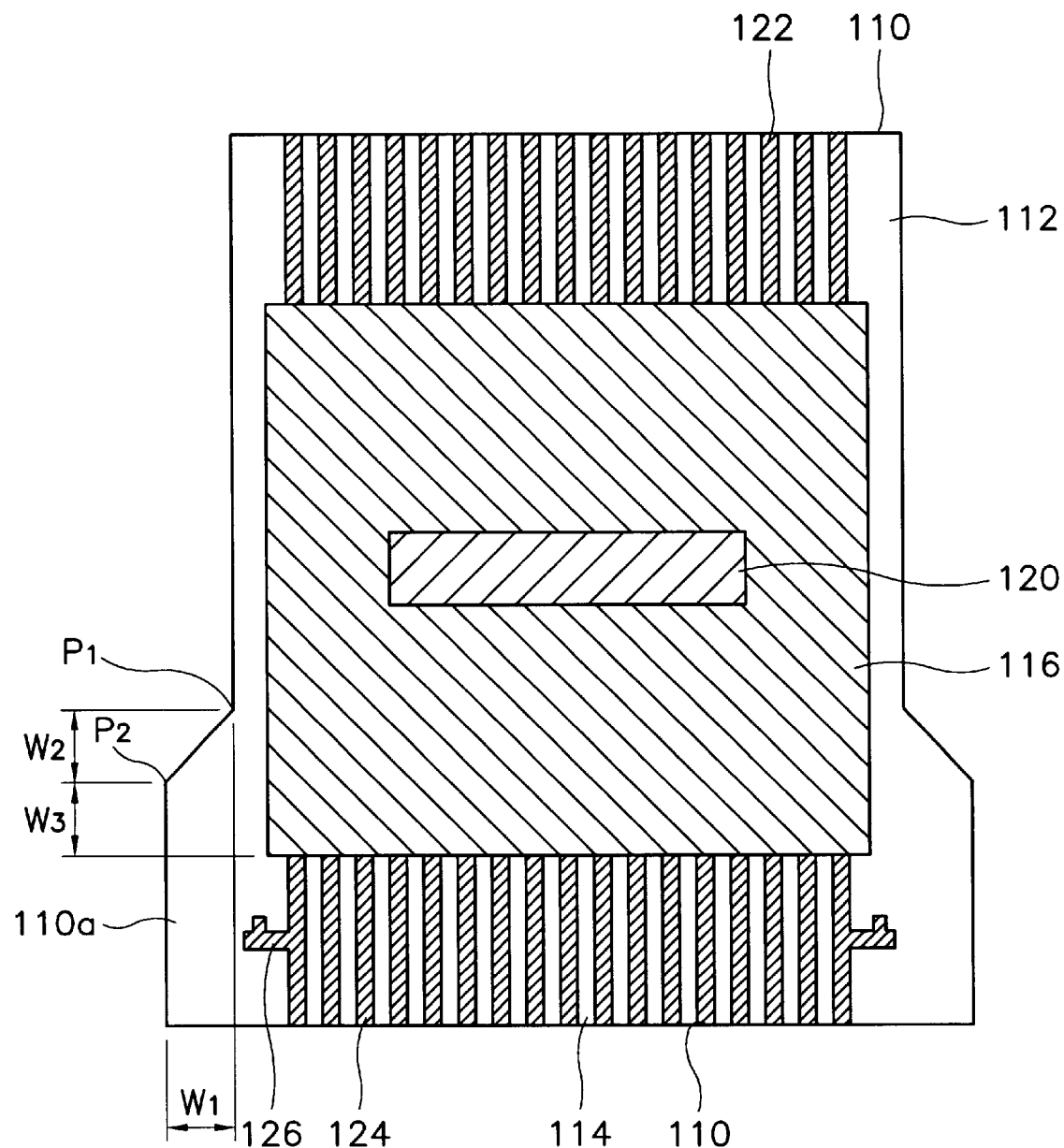
FIG. 5 is a top view showing a flexible circuit board manufactured by a COF package method according to the second preferred embodiment of the present invention.

FIG. 5 is a top view showing a flexible circuit board manufactured by a COF package method based on the second preferred embodiment of the present invention.

In the preferred embodiment, an enlarged portion is formed by extending the width of the base film around the border line of the output side of the solder resin layer is used as a reinforcing member, instead of putting the reinforcing resin layer like the first preferred embodiment. The lower portion of the base film is wider than the central portion of the base film. The same reference numerals are used with respect to the same members as in the first preferred embodiment in FIG. 5.

Referring to FIG. 5, the enlarged portion 110a is formed at both sides of the border line of the solder resin layer 116 and the liquid crystal panel engaging portion 114. A portion of the flexible circuit board where the enlarged portion 110a is formed is wider than the central portion of the base film 110. If the length W1 of the enlarged portion from the central portion is too small, the reinforcing effect is not sufficient and the assembling is not easy. Therefore, the enlarged portion is formed such that the length W1 is about 0.1 to 1 mm, and preferably about 0.3 to 0.8 mm, and more preferably about 0.5 mm.

The enlarged portion 110a is widthwise enlarged by a distance of W1 from a first inflection point P1, and is extended to the end of the liquid crystal panel engaging portion 114 of the base film 110 in parallel to the side surface of the base film 110 at a second inflection P2. It is preferable that the lengthwise distance W2 from the first inflection P1 to the second inflection P2 is determined to be identical with the widthwise extended distance W1. Further, it is preferable that the distance W3 from the second inflection P2 to the border surface is set to about 0.2 to 2 mm, considering the reinforcing effect and the manufacturing.

According to the preferred embodiment, the width of the base film of the border portion of the solder resist layer is larger than that of other places. Therefore, the bending point can be moved towards the central portion of the solder resist, to distribute the stresses of the solder resist layer, thereby preventing the cracks and disconnections of the output side conductive layer patterns.

Bending Tests and Hinge Tests

Bending tests and hinge tests have been done on the liquid crystal display module that mounts the flexible circuit board manufactured according to the second preferred embodiment.

The bending tests and the hinge tests have been done in the same manners as in the first preferred embodiment.

Table 2 represents the results.

TABLE 2

|  | Embodiment 2 | A conventional COF | TCP |
| --- | --- | --- | --- |
| Bending Test | 2100 times | 600 times | 1000 times |
| Hinge Test | No disconnection until 30000 times | 20000 times* |  |

As mentioned above, the flexible circuit board manufactured by the method according to the second preferred embodiment remarkably improves endurance against the cracks and the disconnections of the output side wire patterns caused by the stresses, thereby improving the reliability of the liquid crystal display module.

Embodiment 3

Figure 6:
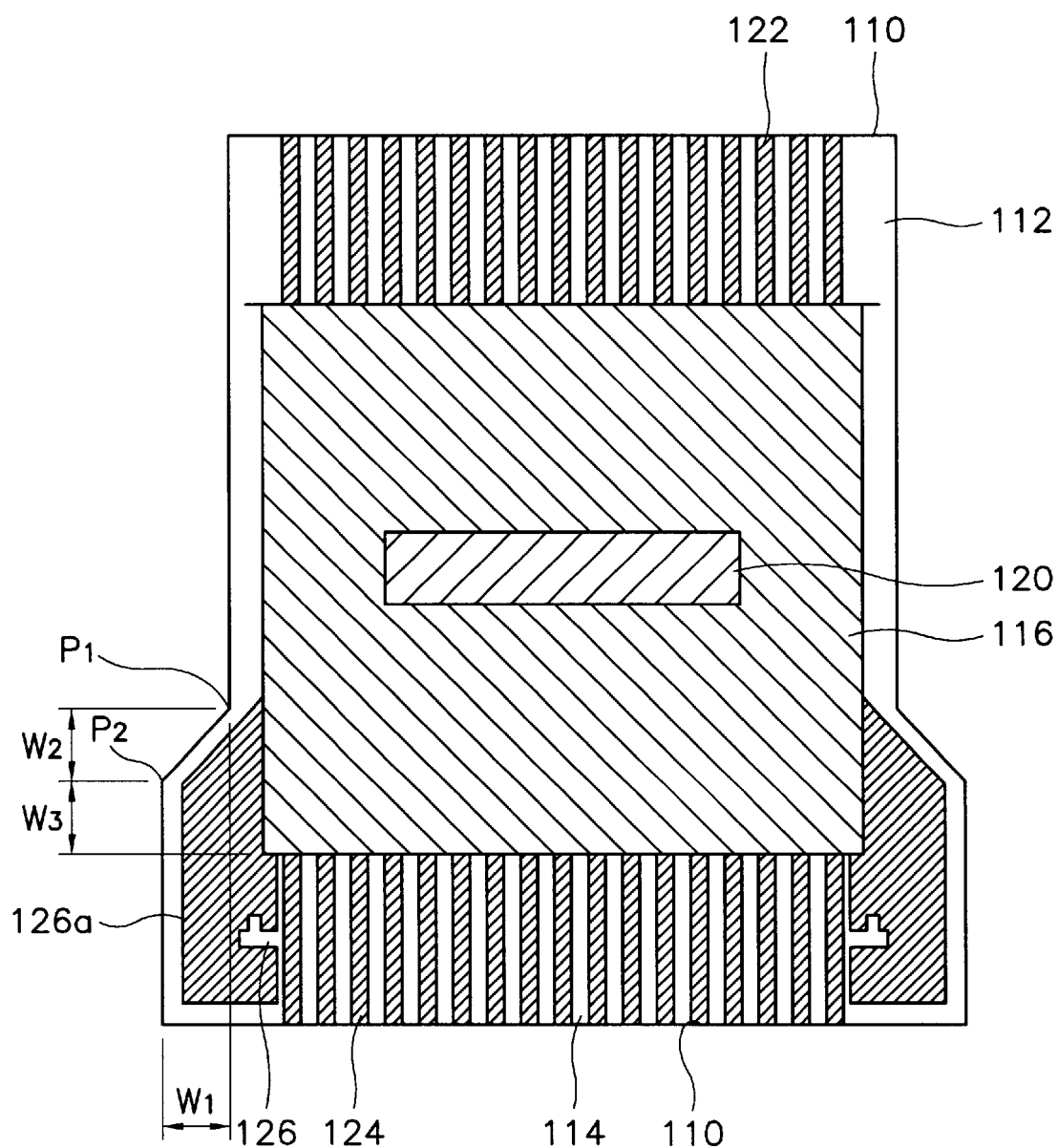
FIG. 6 is a top view showing a flexible circuit board manufactured by a COF package method according to the third preferred embodiment of the present invention.

FIG. 6 is a top view for showing a flexible circuit board manufactured by a COF Package method according to the third preferred embodiment of the present invention.

The third preferred embodiment of the present invention is identical with the second preferred embodiment except that an engraved align mark pattern 126a is formed instead of the align mark pattern 126 formed on the liquid crystal panel engaging portion 114 of the base film 110 of the second preferred embodiment. The same reference numerals are used with respect to the same members as in the first and second preferred embodiments in FIG. 6.

Referring to FIG. 6, the align mark pattern 126a is extended from the outermost patterns of the output side conductive layer patterns 124 of the liquid crystal panel engaging portion 114 of the base film 110 to the enlarged portion 110a of the base film 110. In FIG. 5, the align mark pattern 126 is formed by forming a metal layer on the align mark portion, but in the third preferred embodiment, the align mark pattern 126a of a negative type is formed by forming a metal layer on all portions except for a portion which is used as an align mark. The engraved align mark patterns 126a is extended near an outer border of the enlarged portion 110a.

It is preferable that the align mark pattern 126a is made of the same metal as the output side conductive layer patterns 124. For example, the align mark pattern 126a is made of copper. By using the same metal as the output side conductive layer patterns 124, the align mark pattern 126a can be formed simultaneously when the output side conductive layer patterns 124 are formed.

According to the third preferred embodiment, since the align mark of a negative type is engraved, the solder resist border portion is more reinforced. Therefore, this embodiment can prevent the cracks and the disconnections of the conductive layer patterns that can be generated by stress.

Embodiment 4

Figure 7:
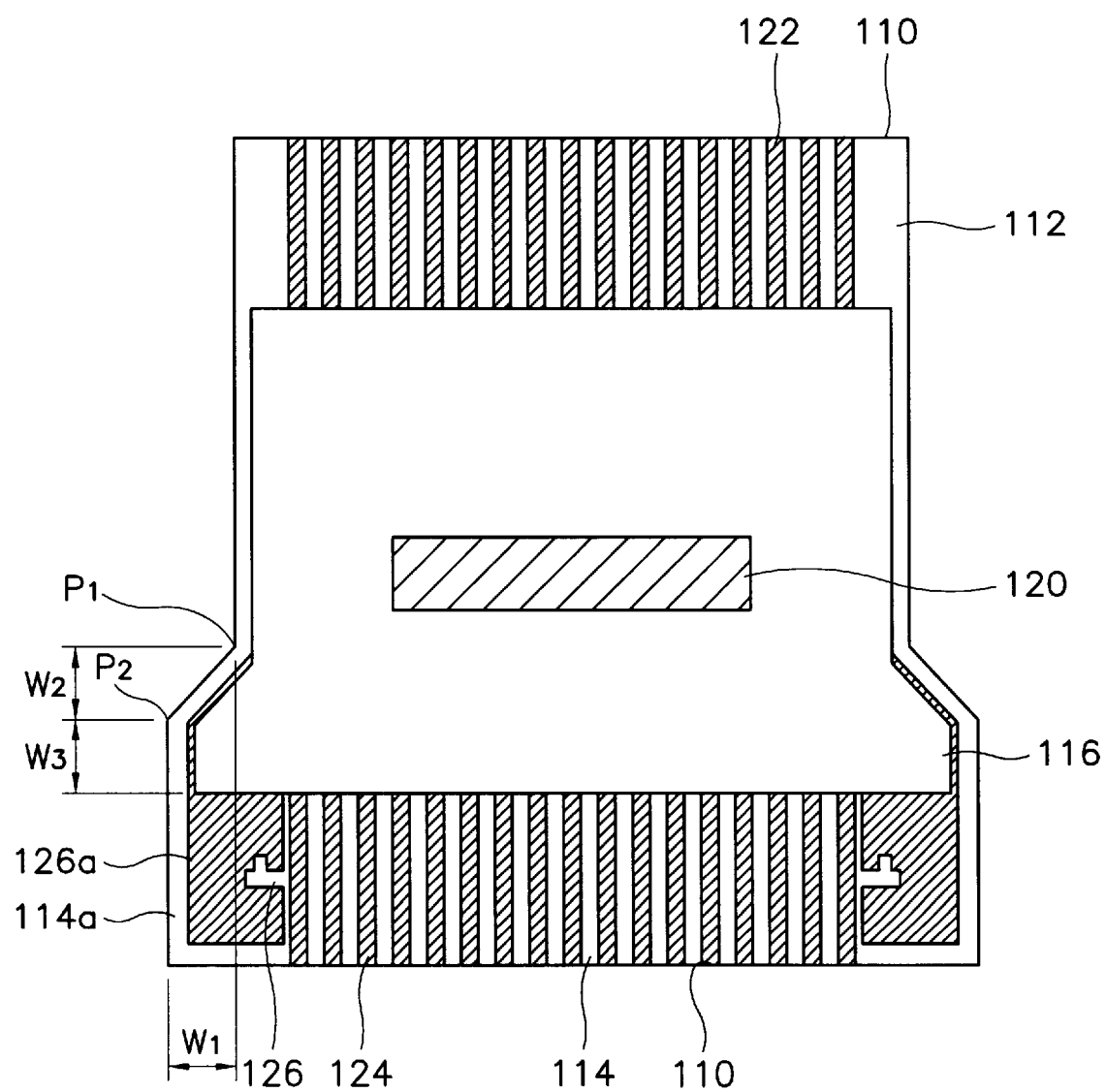
FIG. 7 is a top view showing a flexible circuit board in which a solder resin layer of the flexible circuit board of FIG. 6, is enlarged.

FIG. 7 is a top view of a flexible circuit board manufactured by a COF method according to the fourth preferred embodiment of the present invention.

The fourth preferred embodiment of the present invention is identical with the third preferred embodiment except that the solder resin layer 116 of the third preferred embodiment is extended to the enlarged portion 110. The same reference numerals are used with respect to the same members as in the first, second, and third preferred embodiments in FIG. 7.

The solder resin layer 116 is extended from the periphery of the driving IC 120 to the enlarged portion 110a. More particularly, the solder resin layer 116 covers a portion of the engraved align mark pattern 126 extending from the border portion to the central portion.

According to the fourth preferred embodiment, the bending point of the output side conductive layer pattern is moved towards the central portion, distributing the stresses of the solder resist layer. This prevents the cracks and disconnections of the output side conductive layer pattern.

Embodiment 5

Figure 8:
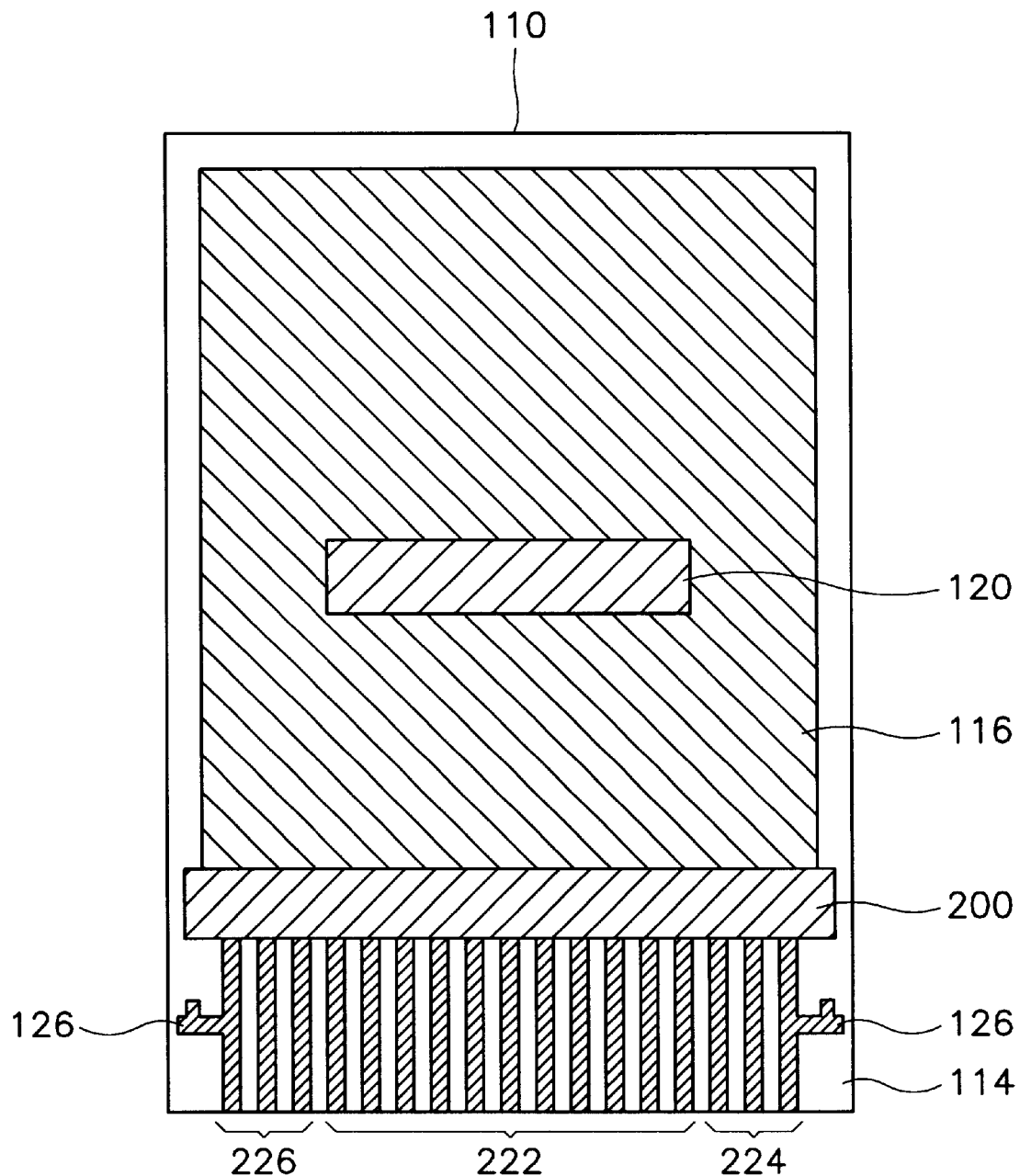
FIG. 8 is a top view showing a flexible circuit board that is manufactured by a COF package method according to the fourth preferred embodiment of the present invention.

FIG. 8 is a flexible circuit board manufactured by a COF method according to the fifth preferred embodiment of the present invention. In the fifth preferred embodiment, the circuit of the gate portion is integrated with the source portion, and the integrated printed circuit board is positioned on the source side of the liquid crystal panel. The flexible circuit board manufactured by the COF method is positioned on the gate side, with the reinforcing member according to the present invention is applied to a liquid crystal panel having a reduced gate side volume.

The fifth preferred embodiment of the present invention shows a flexible circuit board the conductive patterns for inputting and outputting to and from the driving IC are formed in the liquid crystal panel engaging portion. The flexible circuit board according to the fifth preferred embodiment is similar to the flexible circuit boards which are shown in FIGS. 3 to 6. The difference is that the conductive layer pattern locations are different from the first through the fifth preferred embodiments, and that the solder resin layer covers all the portions except for the liquid crystal panel engaging portion.

In the flexible circuit board of the fifth preferred embodiment of the present invention, the input side conductive layer patterns for inputting the signals generated in the printed circuit board to the driving IC and the output side conductive layer patterns for sending the driving signals from the driving IC to the driving devices of the liquid crystal panel, are formed in the liquid crystal panel engaging portion.

Referring to FIG. 8, the solder resin layer 116 covers almost all the portions except for the liquid crystal panel engaging portion 114 of the base film 110. Thus, the liquid crystal panel engaging portion 114 is defined from the lower end of the solder resin layer 116 to the lower end of the flexible base film 110 in FIG. 8.

Inputting conductive layer patterns 224 for inputting the driving signals to the driving IC 120 are formed on one side of the liquid crystal panel engaging portion 114, and connecting conductive layer patterns 226 for transferring the signals inputted to the driving IC 120, to an exterior device such as another flexible circuit board, are formed on the other side of the liquid crystal panel engaging portion 114. Outputting conductive layer patterns 222 for applying the driving signals to the driving device of the liquid crystal panel 140 are formed between the input side conductive layer patterns 224 and the connecting conductive layer patterns 226. A fixing member (not shown) such as a both side bonding tape may be provided on one side of the base film opposite to the liquid crystal panel engaging portion 114, to fix the base film 110 to the bottom surface of the mold frame 160.

The other members of the present embodiment are the same as in the first embodiment and thus any further explanation is omitted.

According to the preferred embodiment of the present invention, the gate circuit portion is integrated with the source circuit portion, and the integrated printed circuit board is positioned on the source side of the liquid crystal panel. The flexible circuit board manufactured by the COF method is positioned on the gate side. Therefore, the disconnections of the conductive layer patterns generated by bending stresses can be prevented.

Embodiment 6

Figure 9:
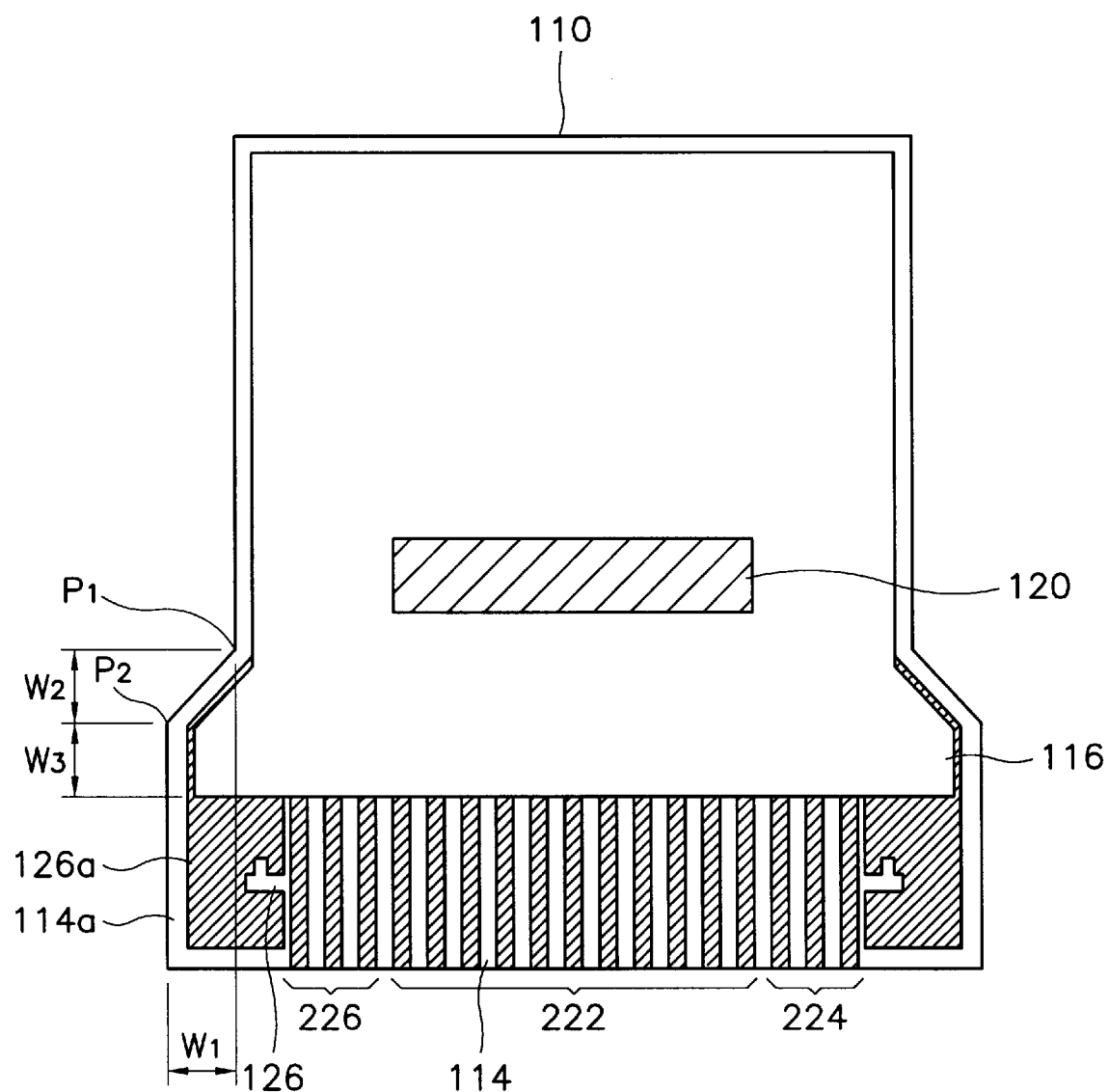
FIG. 9 is a top view showing a flexible circuit board in which a solder resin layer of the flexible circuit board of FIG. 8 is enlarged and an engraved align mark is formed.

FIG. 9 is a flexible circuit board manufactured by a COF method according to the sixth preferred embodiment of the present invention. In the sixth preferred embodiment, the circuit of the gate portion is integrated with the source portion, and the integrated printed circuit board is positioned on the source side of the liquid crystal panel. The flexible circuit board manufactured by the COF method is positioned on the gate side, and the reinforcing member according to the present invention is applied to a liquid crystal panel having a reduced gate side is volume.

The sixth preferred embodiment of the present invention shows a flexible circuit board in which the conductive patterns for inputting and outputting to and from the driving IC are formed in the liquid crystal panel engaging portion.

The flexible circuit board according to the sixth preferred embodiment of the present invention is similar to the flexible circuit board of FIG. 7, except that the conductive layer patterns are identically formed as in the flexible circuit board of FIG. 8, and the solder resin layer covers all the portions except for the liquid crystal panel portion. Therefore, the same reference numerals are used for the same members as in the flexible circuit board shown in FIG. 7.

In the flexible circuit board of the sixth preferred embodiment of the present invention, the input side conductive layer patterns for inputting the signals generated in the printed circuit board to the driving IC and the output side conductive layer patterns for transmitting the driving signals from the driving IC to the driving devices of the liquid crystal panel are formed on the liquid crystal panel engaging portion.

Referring to FIG. 9, the solder resin layer 116 covers almost all the portions except for the liquid crystal panel engaging portion 114 of the base film 110. Inputting conductive layer patterns 224 for inputting the driving signals to the driving IC 120, are formed on one side of the liquid crystal panel engaging portion 114, and connecting conductive layer patterns 226 for transferring the signals inputted to the driving IC 120 to an exterior device such as another flexible circuit board, are formed on the other side of the liquid crystal panel engaging portion 114. Outputting conductive layer patterns 222 for applying the driving signals to the driving device of the liquid crystal panel 140 are formed between the input side conductive layer patterns 224 and the connecting conductive layer patterns 226. A fixing member (not shown) such as a double-sided bonding tape may be provided on one side of the base film opposite to the liquid crystal panel engaging portion 114, to fix the base film 110 to the bottom surface of the mold frame 160.

According to the present invention, a reinforcing member for alleviating the bending is provided in the vicinity of the border surface of the solder resin layer where the output side conductive patterns are formed. The reinforcing member can move the bending point towards the central portion of the solder resist. Therefore, the stresses of the solder resist layer are distributed and thus the curvature change due to the bending is effectively prevented, which eliminates the possibilities of the cracks and disconnections. As a result, the reliability of the liquid crystal panel device is improved.

In the present invention, a liquid crystal display device connecting the flexible circuit board manufactured by the COF method to the liquid crystal panel has been explained. However, the present invention can be applied to a flexible circuit board for driving a gate which is connected to the gate lines of the liquid crystal panel.

As stated above, preferred embodiments of the present invention are shown and described. Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A liquid crystal display device including a display unit having a liquid crystal display panel, a flexible circuit board attached to the liquid crystal display panel for applying driving signals to the liquid crystal display panel-, a back light assembly providing light to the display unit, and a mold frame for receiving the liquid crystal display panel and the back light assembly, the flexible circuit board comprising:

a flexible base film having a liquid crystal panel engaging portion;

a driving IC formed at a central portion of said flexible base film, for applying driving signals to driving devices of the liquid crystal panel;

first conductive layer patterns extended on said flexible base film from the driving IC to the liquid crystal panel engaging portion, for electrically connecting the driving IC to the liquid crystal panel, wherein the first conductive layer patterns extend over at least part of the liquid crystal engaging portion of the flexible base film;

a solder resin layer partially exposing said first conductive layer patterns formed on the liquid crystal panel engaging portion and covering said first conductive layer patterns near said driving IC; and a reinforcing means for preventing said first conductive layer patterns from disconnecting due to bending fatigue of a border portion of the liquid crystal panel engaging portion and said solder resin layer.

2. A liquid crystal display device according to claim 1, wherein said reinforcing means is a reinforcing resin layer covering the border portion.

3. A liquid crystal display device according to claim 2, wherein the reinforcing resin layer is made of a resin that is harder than that of said solder resin layer.

4. A liquid crystal display device according to claim 3, wherein a polyimide resin is used as the resin of said solder resin layer and a urethane resin is used as the resin of the reinforcing resin layer.

5. A liquid crystal display device according to claim 3, wherein the reinforcing resin layer is about 2 to 3 times thicker than solder resin layer.

6. A liquid crystal display device according to claim 3, wherein the reinforcing resin layer is formed such that an end of the reinforcing resin layer extended over a polished inclined surface of a glass board of the liquid crystal panel from the border of said solder resin layer.

7. A liquid crystal display device according to claim 1, wherein said reinforcing means is an extended portion formed by enlarging the width of the border portion of said flexible base film.

8. A liquid crystal display device according to claim 7, wherein the extended portion is formed on both sides of the border portion, and is extended from a position separated from the border portion towards the central portion to both sides of the liquid crystal panel engaging portion of said flexible base film.

9. A liquid crystal display device according to claim 7, wherein the solder resin layer is formed by extending the solder resin layer on the extended portion.

10. A liquid crystal display device according to claim 7, wherein an align mark for engaging with wire patterns of the liquid crystal panel is formed outside the first conductive patterns on the liquid crystal panel engaging portion.

11. A liquid crystal display device according to claim 10, wherein the align mark is extended near an outer border of the extended portion and is of a negative type.

12. A liquid crystal display device according to claim 10, wherein said solder resin layer covers the align mark extended from the border portion to the central portion.

13. A liquid crystal display device according to claim 10, wherein the align mark is comprised of a same metal as the first conductive layer patterns.

14. A liquid crystal display device according to claim 1, wherein the base film comprises a printed circuit board engaging portion on a side opposite to the liquid crystal panel engaging portion, and second conductive layer patterns for electrically connecting the printed circuit board are formed on said flexible base film from the driving IC to the printed circuit board engaging portion.

15. A liquid crystal display device according to claim 14, wherein the solder resin layer exposes the second conductive layer patterns formed on the printed circuit board engaging portion, and covers the second conductive layer patterns located near the driving IC.

16. A liquid crystal panel display device according to claim 1, wherein the first conductive layer patterns comprises inputting conductive layer patterns for inputting the driving signals for driving the liquid crystal panel, and outputting conductive layer patterns that apply the driving signals to the driving devices of the liquid crystal panel.

17. A liquid crystal display device according to claim 16, wherein the first conductive layer patterns further comprises connecting conductive layer patterns for transferring the driving signals inputted to the driving IC to an exterior device.

18. A flexible circuit board, comprising:

a flexible base film having a device engaging portion;

a driving IC formed at a central portion of said flexible base film, for applying driving signals to driving devices;

first conductive layer patterns extended on said flexible base film from said driving IC to the device engaging portion, the first conductive layer patterns extending over at least part of the device engaging portion of the flexible base film;

a solder resin layer partially exposing said first conductive layer patterns formed on the device engaging portion and covering said first conductive layer patterns near said driving IC; and a reinforcing means for preventing first conductive layer patterns from disconnecting due to bending fatigue at a border of the device engaging portion and said solder resin layer.

19. A flexible circuit board according to claim 18, wherein said reinforcing means is a reinforcing resin layer covering the border.

20. A flexible circuit board according to claim 18, wherein said reinforcing means is an extended portion formed by enlarging widths of the border of said flexible base film.

21. A flexible circuit board according to claim 18, wherein said first conductive layer patterns comprises inputting conductive layer patterns for inputting driving signals, and outputting conductive layer patterns that apply the driving signals.

22. A liquid crystal display device according to claim 1, wherein the liquid crystal engaging portion is the portion of the flexible base film extending beyond a first end of the solder resin layer.

23. A liquid crystal display device including a display unit having a liquid crystal display panel, a flexible circuit board attached to the liquid crystal display panel for applying driving signals to the liquid crystal display panel, a back light assembly providing light to the display unit, and a mold frame for receiving the liquid crystal display panel and the back light assembly, the flexible circuit board comprising:

a flexible base film having a liquid crystal panel engaging portion, an outside end of the flexible base film defining an outside end of the liquid crystal panel engaging portion;

a driving IC formed at a central portion of said flexible base film, for applying at least one driving signal to at least one driving device of the liquid crystal panel;

first conductive layer patterns extending on the flexible base film from the driving IC to at least one end of the flexible base film;

a solder resin layer covering a part of the first conductive layer patterns and a first end of the solder resin layer defining an inside end of the liquid crystal engaging portion of the flexible base film layer; and a reinforcing member covering, at least, the first end of the solder resin layer and the inside end of the liquid crystal engaging portion of the flexible base film layer.

* * * * *

UNITED STATES PATENT AND TRADEMARK OFFICE
CERTIFICATE OF CORRECTION

PATENT NO. : 6,657,606 B2  Page 1 of 1
DATED : December 2, 2003
INVENTOR(S) : Sin-Gu Kang et al.

It is certified that error appears in the above-identified patent and that said Letters Patent is hereby corrected as shown below:

Column 10,
Line 51, replace the term "panel-," with the term -- panel, --.

Column 12,
Line 2, replace the term "comprises" with the term -- comprise --.

Signed and Sealed this

Sixth Day of January, 2004

JAMES E. ROGAN
*Director of the United States Patent and Trademark Office*